US008937672B2

(12) United States Patent
Totsuka et al.

(10) Patent No.: US 8,937,672 B2
(45) Date of Patent: Jan. 20, 2015

(54) SOLID-STATE IMAGE SENSOR AND CAMERA (71) Applicant: Canon Kabushiki Kaisha, Tokyo (JP)

(72) Inventors: Hirofumi Totsuka, Fujisawa (JP); Shin Kikuchi, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 9 days.

(21) Appl. No.: 13/934,657

(22) Filed: Jul. 3, 2013

(65) Prior Publication Data

US 2014/0009651 A1  Jan. 9, 2014

(30) Foreign Application Priority Data

Jul. 3, 2012 (JP) .................................. 2012-149755

(51) Int. Cl.
*H04N 3/14* (2006.01)
*H04N 5/335* (2011.01)
*H04N 9/083* (2006.01)
*H04N 9/04* (2006.01)
*H01L 27/146* (2006.01)

(52) U.S. Cl.
CPC .... *H01L 27/14603* (2013.01); *H01L 27/14609* (2013.01)
USPC ............................ 348/302; 348/281; 348/294

(58) Field of Classification Search
CPC ..... H04N 5/369; H04N 5/374; H04N 5/3741; H04N 5/376; H04N 5/3765; H01L 27/14603; H01L 27/14609
USPC .......................................... 348/281, 294, 302
See application file for complete search history.

(56) References Cited

U.S. PATENT DOCUMENTS

| 5,315,102 | A | * | 5/1994 | Abe et al. ................... 250/208.1 |
| 7,688,373 | B2 | * | 3/2010 | Inagaki et al. ................ 348/308 |
| 7,696,543 | B2 | * | 4/2010 | Inagaki et al. ................ 257/291 |
| 7,880,786 | B2 | | 2/2011 | Muramatsu ................... 348/302 |
| 7,916,195 | B2 | * | 3/2011 | Kudoh ......................... 348/294 |
| 8,094,225 | B2 | * | 1/2012 | Yamashita .................... 348/302 |
| 8,098,312 | B2 | * | 1/2012 | Matsuo et al. ................ 348/294 |
| 8,575,557 | B2 | * | 11/2013 | Okada ..................... 250/370.08 |
| 8,592,880 | B2 | * | 11/2013 | Inagaki et al. ................ 257/291 |
| 2004/0173864 | A1 | * | 9/2004 | Inagaki et al. ................ 257/443 |
| 2006/0192263 | A1 | * | 8/2006 | Inagaki et al. ................ 257/443 |
| 2010/0053398 | A1 | * | 3/2010 | Yamashita .................... 348/302 |
| 2010/0157123 | A1 | * | 6/2010 | Inagaki et al. ................ 348/300 |
| 2010/0163712 | A1 | * | 7/2010 | Inagaki et al. ............. 250/208.1 |

(Continued)

FOREIGN PATENT DOCUMENTS

| JP | 2005-311821 A | 4/2005 |
| JP | 2011-82769 A | 4/2011 |

*Primary Examiner* — Chia-Wei A Chen
(74) *Attorney, Agent, or Firm* — Fitzpatrick, Cella, Harper & Scinto (57) ABSTRACT

A solid-state image sensor including a wiring portion which includes a first line, a second line and a control line, in first to third regions arranged sequentially, wherein the first line includes a first pattern in a first layer in the first and second regions and a second pattern in a second layer in the third region, and these patterns are connected each other between the second region and the third region, the second line includes a third pattern in the second layer in the first region and a fourth pattern in the first layer in the second and third regions, the these patterns are connected each other between the first region and the second region, and the control line includes a pattern in the second layer in the second region, intersecting with the first pattern and the fourth pattern.

8 Claims, 8 Drawing Sheets

(56) References Cited

U.S. PATENT DOCUMENTS

| | | | |
|---|---|---|---|
| 2010/0165162 A1* | 7/2010 | Inagaki et al. | 348/300 |
| 2010/0177226 A1* | 7/2010 | Itonaga et al. | 348/300 |
| 2011/0080492 A1 | 4/2011 | Matsuda et al. | 348/222.1 |
| 2011/0128400 A1* | 6/2011 | Wakano et al. | 348/222.1 |
| 2011/0128426 A1* | 6/2011 | Taruki et al. | 348/300 |
| 2011/0272751 A1* | 11/2011 | Inagaki et al. | 257/292 |
| 2012/0132822 A1* | 5/2012 | Okada | 250/370.08 |
| 2012/0181441 A1* | 7/2012 | Okada | 250/370.08 |
| 2013/0002915 A1* | 1/2013 | Itonaga et al. | 348/300 |
| 2013/0248953 A1* | 9/2013 | Endo et al. | 257/291 |
| 2013/0258150 A1* | 10/2013 | Kanbe | 348/296 |
| 2013/0278807 A1* | 10/2013 | Horiike et al. | 348/308 |
| 2013/0279650 A1* | 10/2013 | Fujita et al. | 378/19 |

\* cited by examiner

SOLID-STATE IMAGE SENSOR AND CAMERA

BACKGROUND OF THE INVENTION

1. Field of the Invention

The present invention relates to a solid-state image sensor and a camera.

2. Description of the Related Art

A solid-state image sensor includes a pixel array in which a plurality of pixels are arranged. Japanese Patent Laid-Open No. 2005-311821 discloses an arrangement in which a plurality of column signal lines are arranged in each column of the pixel array. According to Japanese Patent Laid-Open No. 2005-311821, a plurality of pixel signals can be read out from each column of the pixel array simultaneously, thereby making a high read rate possible.

Along with an increase in pixel density of the solid-state image sensor, a layout technique of a signal wiring, which achieves the high rate while improving light collection efficiency, is required. Japanese Patent Laid-Open No. 2011-82769 discloses an example of a layout technique of a structure in which a plurality of signal wirings are arranged in each column of the pixel array parallelly. For example, FIG. 4 of Japanese Patent Laid-Open No. 2011-82769 discloses a structure in which a first column readout line 106_even and a second column readout line 106_odd are alternately formed adjacent to an output unit (a diffusion region of a row selection transistor 105) for each row of pixels. This can be done with a plurality of wiring layers.

In order to arrange a control line for controlling each pixel in the pixel array, a layout needs to be contrived to form, using a small number of wiring layers, a portion in which the control line, and the first and the second column readout lines intersect.

SUMMARY OF THE INVENTION

It is an object of the present invention to provide a layout technique of a signal wiring advantageous for increasing the pixel density of a solid-state image sensor.

One of the aspects of the present invention provides a solid-state image sensor including a pixel array region in which a plurality of pixels are arranged to form a plurality of rows and columns, wherein in the pixel array region, a first column signal line and a second column signal line configured to transfer signals from corresponding pixels respectively, and a control line configured to control the corresponding pixels are arranged, a region in which the first column signal line, the second column signal line and the control line are arranged includes a wiring portion including a first region, a second region and a third region arranged sequentially in a column direction, the first column signal line includes a first pattern arranged in a first wiring layer of the first wiring layer and a second wiring layer which are different layers in the first region and the second region, and includes a second pattern arranged in the second wiring layer in the third region, and the first pattern and the second pattern are electrically connected by an electrically conductive member between the second region and the third region, the second column signal line includes a third pattern arranged in the second wiring layer in the first region, and includes a fourth pattern arranged in the first wiring layer in the second region and the third region, and the third pattern and the fourth pattern are electrically connected by an electrically conductive member between the first region and the second region, and the first pattern and the third pattern are superposed through an interlayer insulation film in the first region, the second pattern and the fourth pattern are superposed through an interlayer insulation film in the third region, and the control line includes a pattern arranged in the second wiring layer in the second region and intersecting with the first pattern and the fourth pattern through an interlayer insulation film.

Further features of the present invention will become apparent from the following description of exemplary embodiments with reference to the attached drawings.

DESCRIPTION OF THE EMBODIMENTS

First Embodiment

Figure 1:
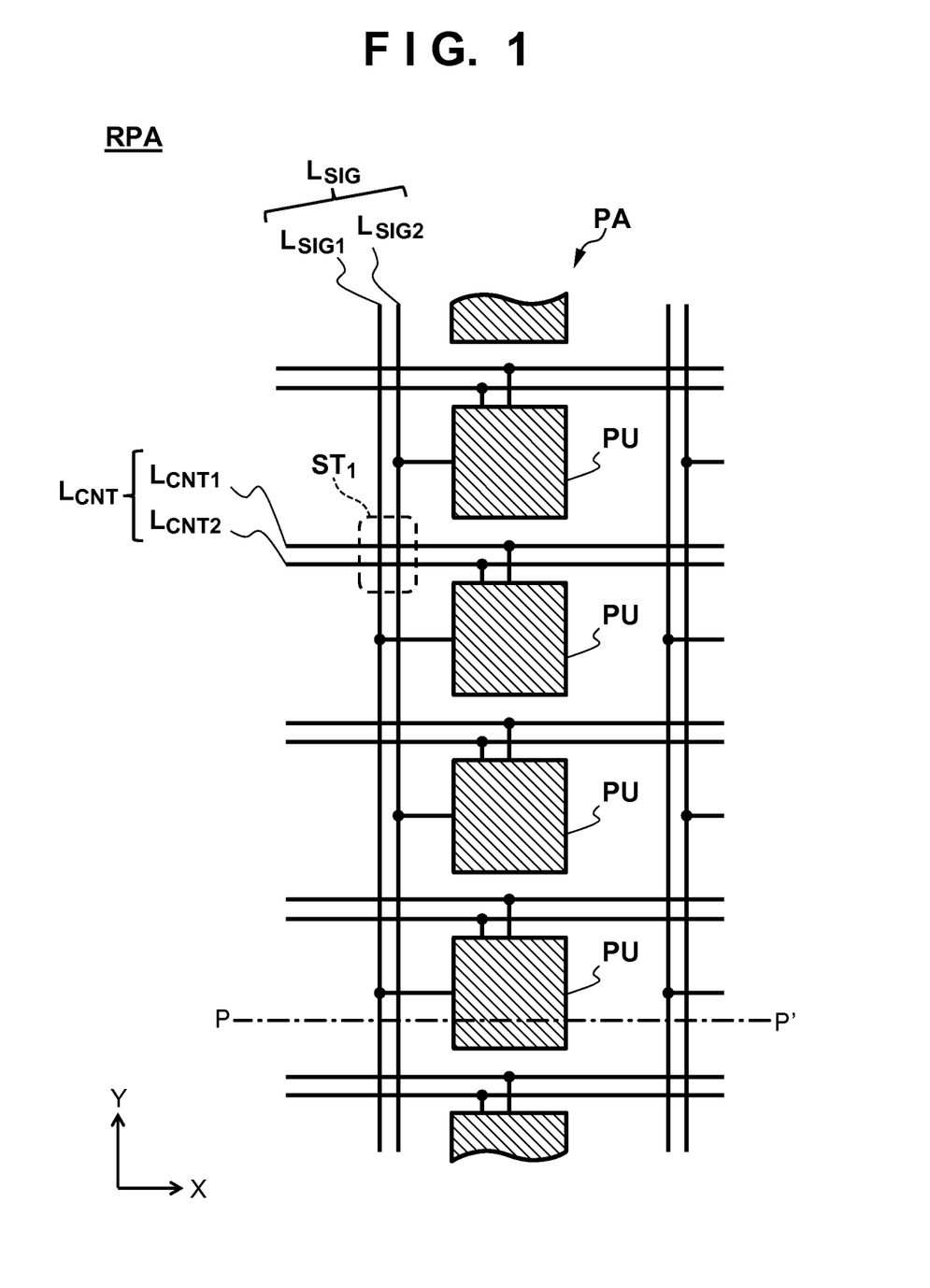
FIG. 1 is a view for explaining an example of a portion of an arrangement of a pixel array.

A solid-state image sensor $I_1$ according to the first embodiment will be described with reference to FIGS. 1 to 5. The solid-state image sensor $I_1$ includes a pixel array PA in which a plurality of pixels PU are arranged to form a plurality of rows and columns. FIG. 1 shows the pixels PU of four rows× one column, for the sake of simplicity. A region in which the pixel array PA is arranged is defined as a pixel array region RPA. For example, column signal lines $L_{SIG}$ (a first column signal line $L_{SIG1}$ and a second column signal line $L_{SIG2}$) which transfer a signal from a corresponding pixel PU, and control lines $L_{CNT}$ (a first control line $L_{CNT1}$ and a second control line $L_{CNT2}$) for controlling the corresponding pixel PU are arranged in the pixel array region RPA. In FIG. 1, an X direction represents a row direction, and a Y direction represents a column direction. The pixel signal read out from each pixel PU is transferred to a processor (not shown) via corresponding column signal lines $L_{SIG}$.

Figure 2:
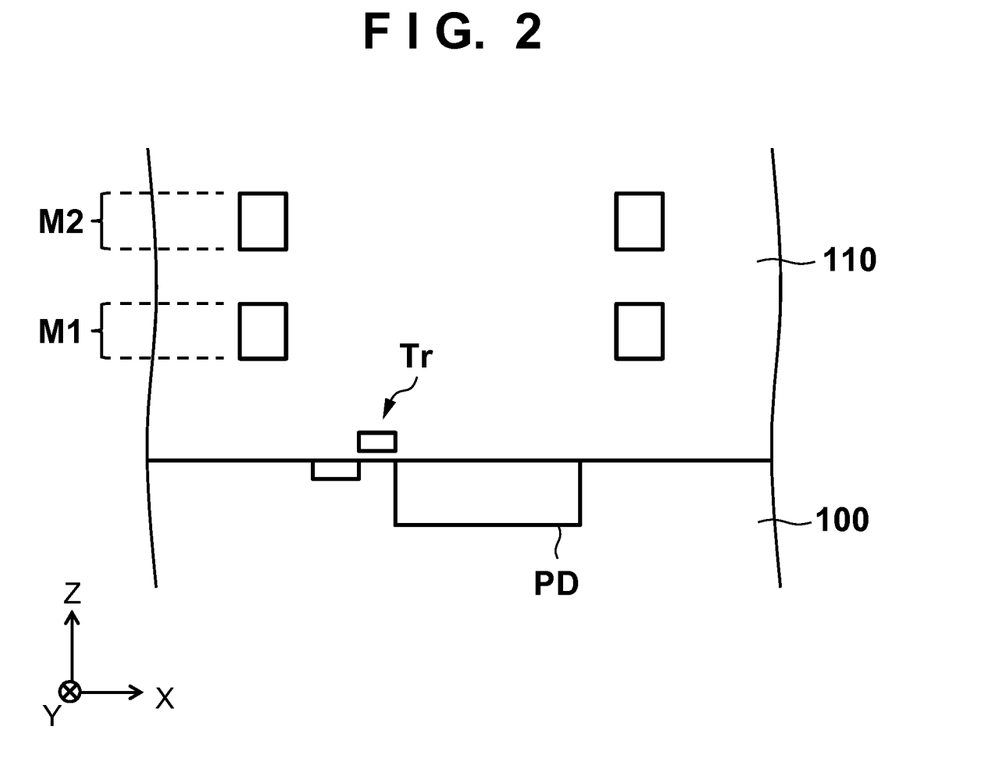
FIG. 2 is a view for explaining an example of a sectional structure of a pixel array region.

FIG. 2 schematically shows a portion of a sectional structure along a cut line P-P' in FIG. 1. The pixel PU is formed on a substrate 100 (such as silicon substrate), and includes a photodiode PD (photoelectric conversion element) and one or more transistors Tr. An interlayer insulation film 110, and a first wiring layer M1 and a second wiring layer M2 which are different layers are arranged on them. In FIG. 2, a Z direction represents a direction which intersects with a plane formed by the X direction and the Y direction. For example, the interlayer insulation film 110 is made of $SiO_2$, and can be arranged between the substrate and the first wiring layer M1, between the first wiring layer M1 and the second wiring layer M2, and on the second wiring layer M2. Here, the first wiring layer M1 can be a wiring layer which is closest to the substrate 100, and the second wiring layer M2 can be a wiring layer on the first wiring layer M1. For example, a metal such as Al (aluminum) or Cu (copper) can be used for patterns arranged in each wiring layer. Although these patterns can use three or more wiring layers, it is better to form them with a small number of wiring layers to shorten a distance between an incident light and a photoelectric conversion unit and suppress attenuation of light. Here, a case in which two wiring layers are used will be described. In the following description, a case in which a via is used as a technique of electrically connecting each pattern will be described. However, the present invention is not limited to this as long as each pattern is electrically connected by an electrically conductive member.

Figure 3:
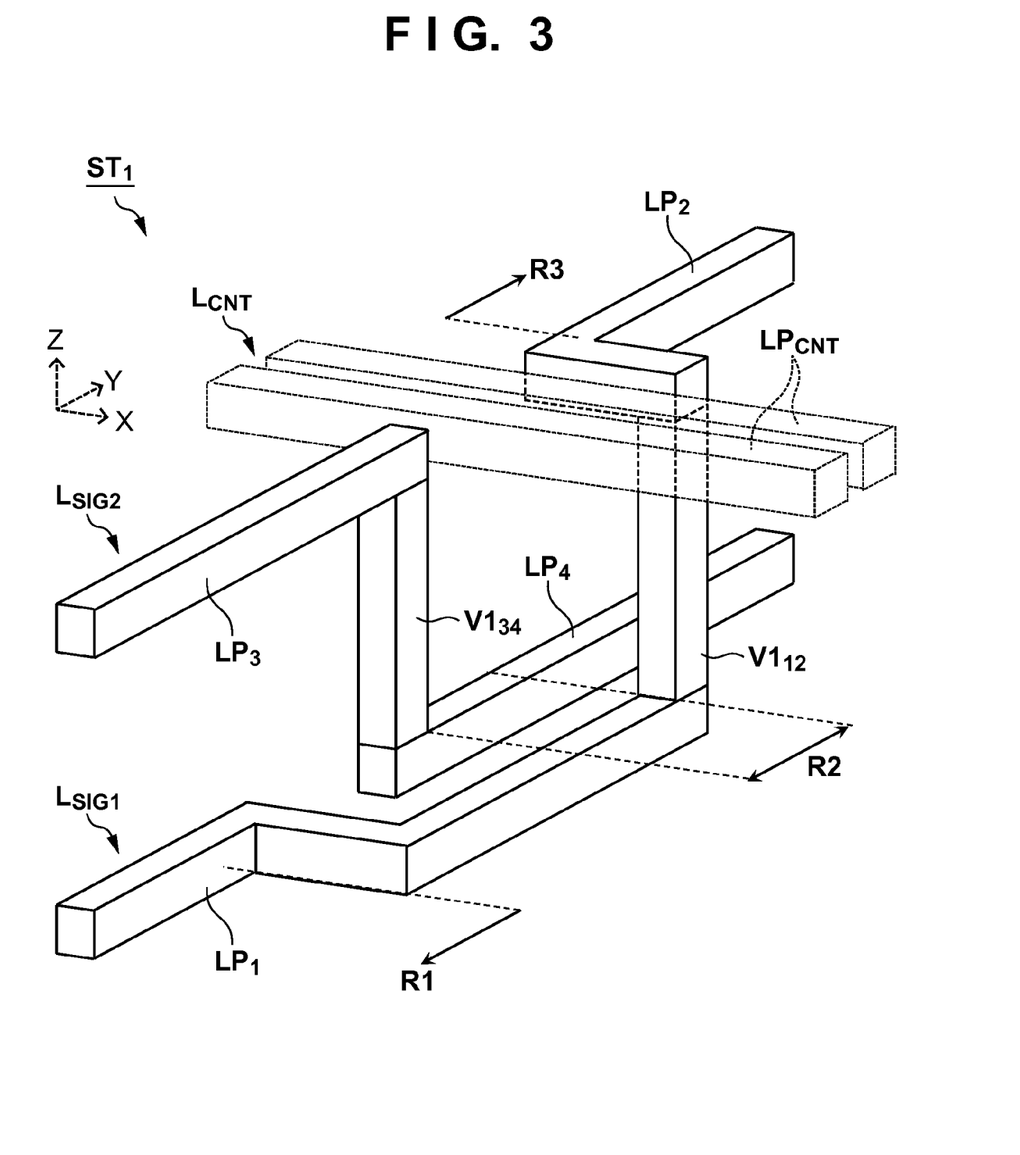
FIG. 3 is a view for explaining an example of a wiring portion according to the first embodiment.

FIG. 3 is a schematic view three-dimensionally showing a region in which the column signal lines $L_{SIG}$ and the control lines $L_{CNT}$ are arranged. This region has a wiring portion $ST_1$ including a first region R1, a second region R2 and a third region R3, which are sequentially arranged toward the Y direction. The first column signal line $L_{SIG1}$ includes a first pattern $LP_1$ arranged in the first wiring layer M1 in the first region R1 and the second region R2. Also the first column signal line $L_{SIG1}$ includes a second pattern $LP_2$ arranged in the second wiring layer M2 in the third region R3. Furthermore, the first pattern $LP_1$ and the second pattern $LP_2$ are connected by a via $V1_{12}$ between the second region R2 and the third region R3. Similarly, the second column signal line $L_{SIG2}$ includes a third pattern $LP_3$ arranged in the second wiring layer M2 in the first region R1. The second column signal line $L_{SIG2}$ includes a fourth pattern $LP_4$ arranged in the first wiring layer M1 in the second region R2 and the third region R3. The third pattern $LP_3$ and the fourth pattern $LP_4$ are connected by a via $V1_{34}$ between the first region R1 and the second region R2.

Here, the first pattern $LP_1$ and the third pattern $LP_3$ are superposed through the interlayer insulation film in the first region R1. In addition, the second pattern $LP_2$ and the fourth pattern $LP_4$ are superposed through the interlayer insulation film in the third region R3. Here, "superpose" means that regions of the two patterns need only be overlapped partially when viewed from the z direction, and the both patterns in a planar view may not match completely. The control lines $L_{CNT}$ include a pattern $LP_{CNT}$ arranged in the second wiring layer M2 in the second region R2. The pattern $LP_{CNT}$ intersects with the first pattern $LP_1$ and the fourth pattern $LP_4$ through the interlayer insulation film.

In the second region R2, since the first column signal line $L_{SIG1}$ and the second column signal line $L_{SIG2}$ intersect with the control lines $L_{CNT}$, the first column signal line $L_{SIG1}$ and the second column signal line $L_{SIG2}$ here form patterns, respectively, which can be arranged parallelly, in the first wiring layer M1. As a result, the first pattern $LP_2$ and the third pattern $LP_2$ are not superposed through the interlayer insulation film between the first region R1 and the second region R2. In addition, the second pattern $LP_2$ and the fourth pattern $LP_4$ are not superposed through the interlayer insulation film between the second region R2 and the third region R3.

For example, when the first column signal line $L_{SIG1}$ and the second column signal line $L_{SIG2}$ are arranged along each column of the pixel array PA, and the control lines $L_{CNT}$ are arranged along each row, the intersection of the wiring described above exists in correspondence with each pixel. Therefore, at least two wiring portions $ST_2$ can be formed in the pixel array region RPA and repeatedly formed for a predetermined number of rows. This uniformizes the respective load impedances of the column signal lines and the readout characteristics of respective pixel signals, and it is possible to reduce variation.

Figure 4:
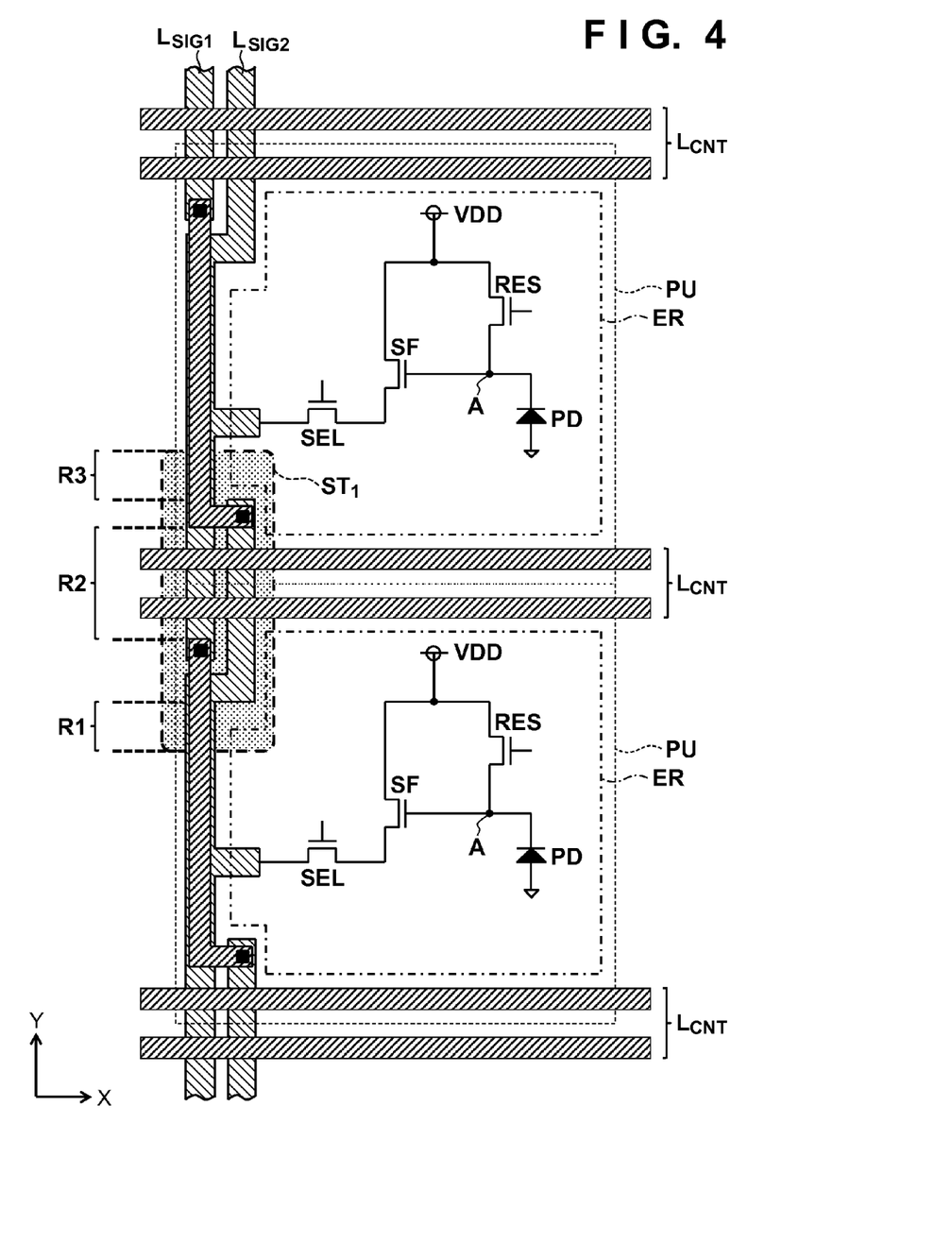
FIG. 4 is a view for explaining an example of a layout according to the first embodiment.

FIG. 4 is a schematic plan view of the pixel array region RPA (2 rows×1 column). As illustrated in FIG. 4, each pixel PU can include the photoelectric conversion unit PD (such as photodiode), a node A, a reset transistor RES, a source-follower transistor SF and a selection transistor SEL. A signal corresponding to the amount of electric charges generated by receiving light in the photoelectric conversion unit PD, is transferred to the node A. The node A has a capacitance component including the gate capacitance of the source-follower transistor SF and the diffusion capacitance of the reset transistor RES, and forms an electric potential depending on the amount of the electric charges. The amount of a current flowing through the source-follower transistor SF connected to a power VDD changes depending on fluctuations of its gate electric potential, that is, an electric potential of the node A. The gate terminal of the selection transistor SEL receives a selection signal. When the selection signal is activated, the selection transistor SEL outputs the pixel signal depending on the amount of the current of the source-follower transistor SF to the column signal lines $L_{SIG}$. Also, the gate terminal of the reset transistor RES receives a reset signal. When the reset signal is activated, the reset transistor RES resets the electric potential of the node A. The selection signal and the reset signal described above are transferred by the respective control lines $L_{CNT}$ (the first control line $L_{CNT1}$ and the second control line $L_{CNT2}$).

As illustrated in FIG. 4, since the wiring portion $ST_1$ can be formed in a boundary region of each pixel PU, the decrease in an aperture ratio can be suppressed and a light collection ratio can be increased. In addition, for example, a region ER can be allocated to the photoelectric conversion unit PD effectively, thereby increasing sensitivity. Note that the pixel signal from the pixel PU is output from one diffusion layer of the selection transistor SEL to the column signal lines, and a control signal including the selection signal and the reset signal is input to the gate terminal of the corresponding transistor. Therefore, a pattern for inputting and outputting these signals can be laid out to be arranged in the first wiring layer M1, as needed.

Figure 5:
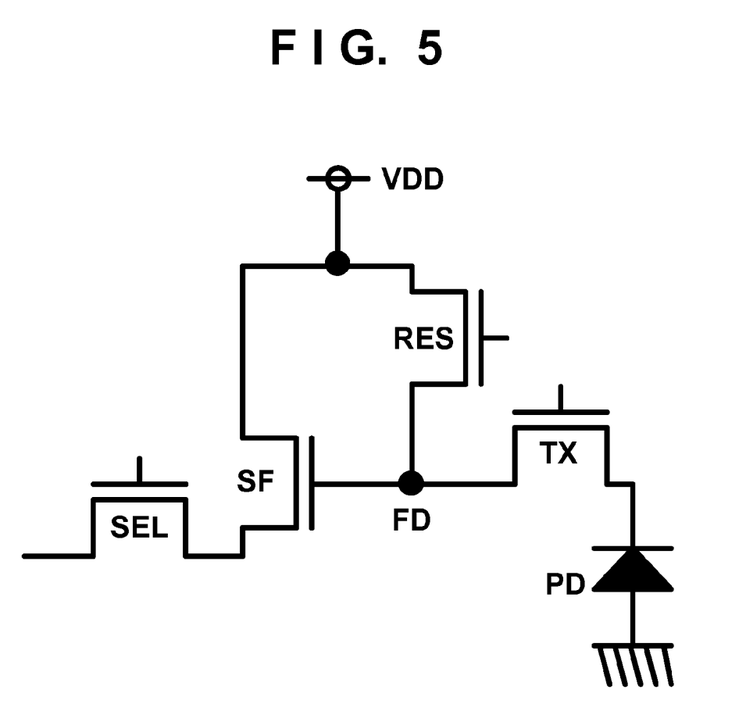
FIG. 5 is a view for explaining an example of an arrangement of a pixel.

Also the pixel PU, as illustrated in FIG. 5, may include a transfer transistor TX between the photoelectric conversion unit PD and the node A. In this case, the gate terminal of the transfer transistor TX receives a transfer signal, where three control lines $L_{CNT}$ can be used and the transfer signal can be transferred by a third control line (not shown). When the transfer signal is activated, electric charges generated and accumulated in the photoelectric conversion unit PD are transferred to the node A. The capacitance component of the node A also includes the diffusion layer capacitance of a transfer transistor A, and is referred to as a floating diffusion capacitance (FD).

As described above, in this embodiment, for example, the first wiring layer M1 serves as a layer closest to the substrate, and the second wiring layer M2 serves as a layer on the first wiring layer M1. However, the present invention is not limited to this form, and these positional relationships may be reverse. Also the wiring portion $ST_1$ described above may be formed using another wiring layer (such as a third wiring layer). In addition, the number of the column signal lines $L_{SIG}$ or the control lines $L_{CNT}$ is not limited to the above number. Furthermore, in a region where the wiring portion $ST_1$ described above is not formed, respective patterns of two control lines $L_{CNT}$ may be formed to be superposed through the interlayer insulation film 110 in the same manner as the respective patterns of the first column signal line $L_{SIG1}$ and the second column signal line $L_{SIG2}$.

In this way, the wiring portion $ST_1$ forms a structure in which the column signal lines $L_{SIG}$ and the control lines $L_{CNT}$ intersect. This structure suppresses the decrease in the aperture ration in the first region R1 and the third region R3, and also uniformizes the readout characteristics of the respective pixel signals, and reduces variation, while allowing two or more wiring portions to intersect in the second region R2. As described above, the solid-state image sensor $I_1$ is advantageous for increasing a pixel density in a layout design of the signal wiring.

Second Embodiment

Figure 6:
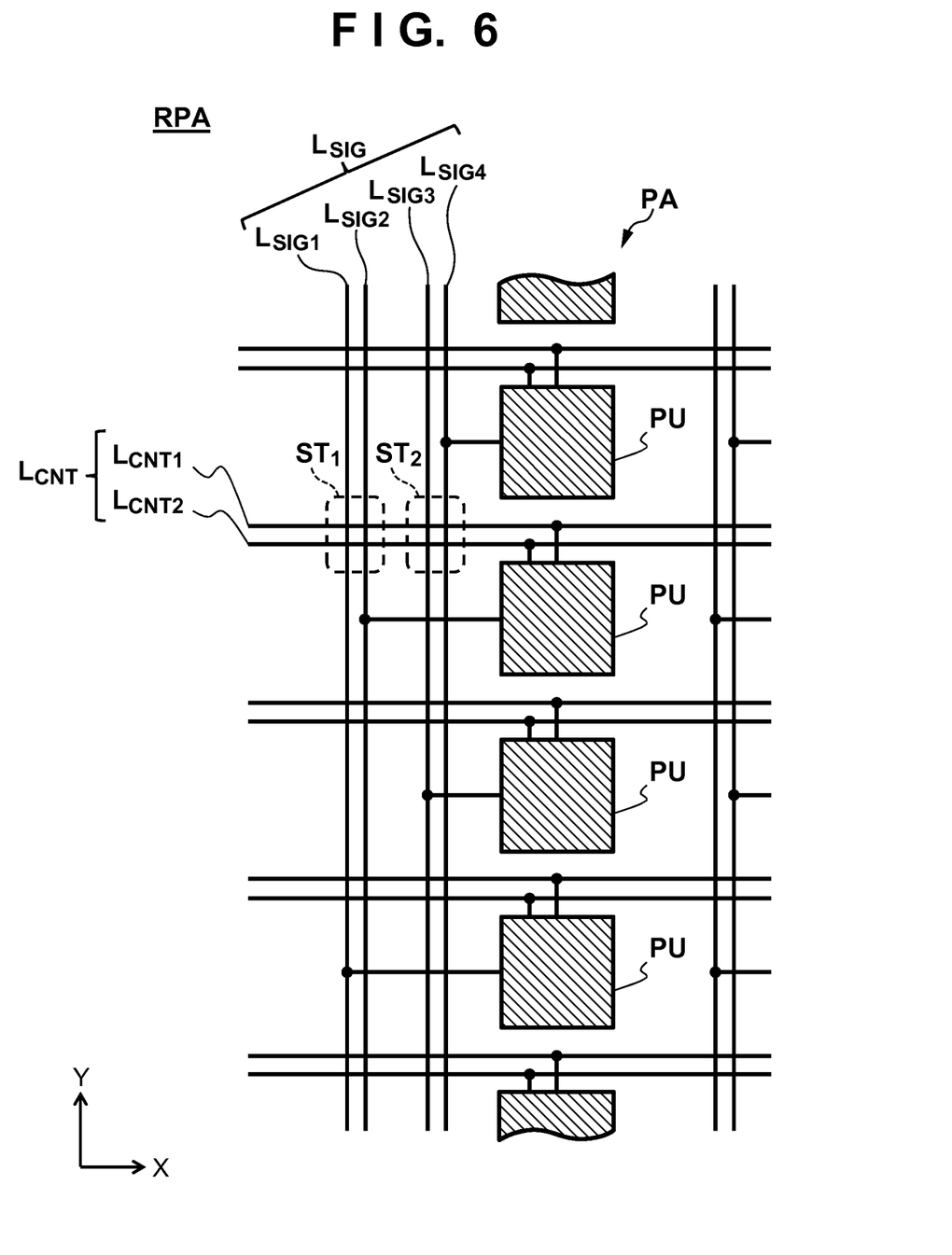
FIG. 6 is a view for explaining another example of a portion of the arrangement of the pixel array.

A solid-state image sensor $I_2$ according to the second embodiment will be described with reference to FIGS. 6 to 8. As illustrated in FIG. 6, this embodiment is different from the first embodiment in that a third column signal line $L_{SIG3}$ and a fourth column signal line $L_{SIG4}$ are also arranged in a pixel array region RPA. With this arrangement, two signal processing units (or simply processors) perform a signal processing for a pixel signal read out from a pixel array PA, thus achieving a high signal processing speed. Specifically, for example, a first signal processing unit (not shown) can perform the signal processing for a pixel signal read out by a first column signal line $L_{SIG1}$ and a second column signal line $L_{SIG2}$. In addition, a second signal processing unit (not shown) can perform the signal processing for a pixel signal read out by the third column signal line $L_{SIG3}$ and the fourth column signal line $L_{SIG4}$.

A region in which the third column signal line $L_{SIG3}$, the fourth column signal line $L_{SIG4}$, and control lines $L_{CNT}$ are arranged includes a wiring portion $ST_2$ (a second wiring portion), which includes a fourth region R4, a fifth region R5, and a sixth region R6 arranged sequentially in a column direction. Here, the wiring portion $ST_2$ can be formed in the same manner as a wiring portion $ST_1$. Specifically, the first column signal line $L_{SIG1}$ and the second column signal line $L_{SIG2}$ correspond to the third column signal line $L_{SIG3}$ and the fourth column signal line $L_{SIG4}$, and a first region R1 to a third region R3 correspond to the fourth region R4 to the sixth region R6. The third column signal line $L_{SIG3}$ includes a fifth pattern $LP_5$ and a sixth pattern $LP_6$, the fourth column signal line $L_{SIG4}$ includes a seventh pattern $LP_7$ and a eighth pattern $LP_8$, and the first pattern $LP_1$ to the fourth pattern $LP_4$ correspond to the fifth pattern $P_5$ to the eighth pattern $LP_8$.

Like the first embodiment, at least two wiring portions $ST_1$ and at least two wiring portions $ST_2$ can be formed in the pixel array region RPA, and repeatedly formed for a predetermined number of rows. In this embodiment, they are formed every two rows. This uniformizes the respective load impedances of the column signal lines and the readout characteristics of respective pixel signals, and it is possible to reduce variation.

Figure 7:
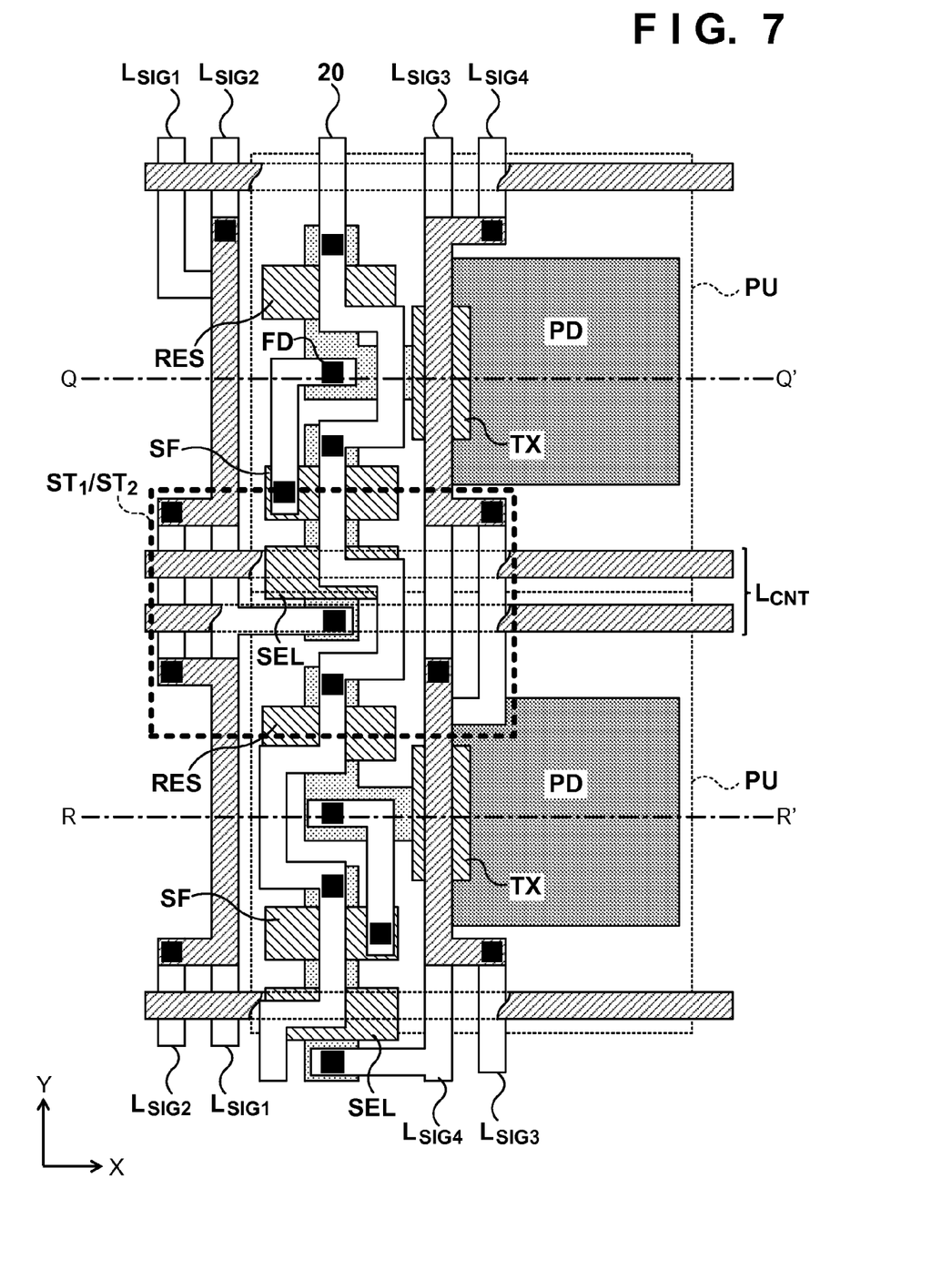
FIG. 7 is a view for explaining an example of a layout according to the second embodiment.
Figure 8:
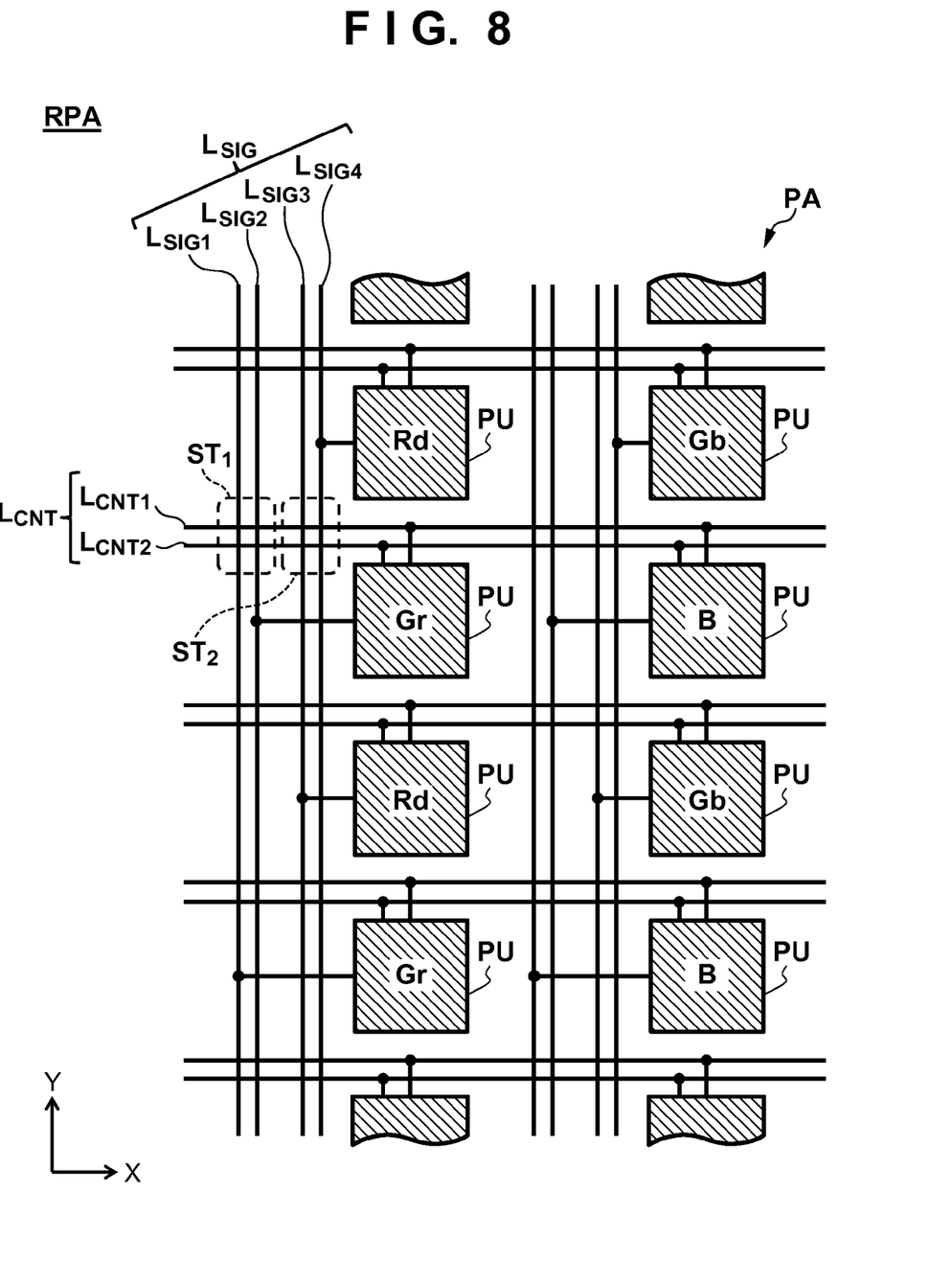
FIG. 8 is a view for explaining another example of a portion of the arrangement of the pixel array.

Like FIG. 4, FIG. 7 is a schematic plan view of the pixel array region RPA (2 rows×1 column) according to this embodiment. A layout arrangement of the pixel PU shows a case in FIG. 5. The respective pixels PU of the pixel array PA are preferably designed to be laid out in the same shape in terms of, for example, reducing manufacturing variations in the manufacturing process. For example, the gate electrode of a transfer transistor TX of each pixel PU is arranged in the same position (or orientation) as another pixel PU, as illustrated in FIG. 7. As a result, the first column signal line $L_{SIG1}$ to the fourth column signal line $L_{SIG4}$ can be arranged in a position adjacent to an electrode which reads out the pixel signal of each pixel PU. Here, an FD (floating diffusion capacitance) described in the first embodiment is preferably laid out to position between the first column signal line $L_{SIG1}$ and the second column signal line $L_{SIG2}$, and the third column signal line $L_{SIG3}$ and the fourth column signal line $L_{SIG4}$. This facilitates connecting an electrode for reading out the pixel signal of each pixel PU to any column signal lines $L_{SIG}$.

In addition, a power wiring pattern 20 is arranged in a first wiring layer M1 between the group of the first pattern $LP_1$ to the fourth pattern $LP_4$ of the first column signal line $L_{SIG1}$ and the second column signal line $L_{SIG2}$, and the group of the fifth pattern $LP_5$ to the eighth pattern $LP_8$ of the third column signal line $L_{SIG3}$ and the fourth column signal line $L_{SIG4}$. This can prevent a crosstalk between the first column signal line $L_{SIG1}$ and the second column signal line $L_{SIG2}$, and the third column signal line $L_{SIG3}$ and the fourth column signal line $L_{SIG4}$.

Specifically, in a cut line Q-Q', the patterns of the first column signal line $L_{SIG1}$ and the second column signal line $L_{SIG2}$, an FD pattern, the power wiring pattern 20, and the patterns of the third column signal line $L_{SIG3}$ and the fourth column signal line $L_{SIG4}$ are sequentially arranged toward an X direction. A pixel signal according to this FD is transferred by the first column signal line $L_{SIG1}$ or the second column signal line $L_{SIG2}$. Therefore, the power wiring pattern 20 is arranged between the FD pattern, and the patterns of the third column signal line $L_{SIG3}$ and the fourth column signal line $L_{SIG4}$, thus reducing an influence on the FD by the third column signal line $L_{SIG3}$ and the fourth column signal line $L_{SIG4}$. On the other hand, in a cut line R-R', the patterns of first column signal line $L_{SIG1}$ and the second column signal line $L_{SIG2}$, the power wiring pattern 20, the FD pattern, and the patterns of the third column signal line $L_{SIG3}$ and the fourth column signal line $L_{SIG4}$ are sequentially arranged toward the X direction. The pixel signal according to this FD is transferred by the third column signal line $L_{SIG3}$ or the fourth column signal line $L_{SIG4}$. Therefore, the power wiring pattern 20 is arranged between the FD pattern, and the patterns of the first column signal line $L_{SIG1}$ and the second column signal line $L_{SIG2}$, thus reducing an influence on the FD by the first column signal line $L_{SIG1}$ and the second column signal line $L_{SIG2}$.

As described above, in the solid-state image sensor $I_2$ further having the third column signal line $L_{SIG3}$ and the fourth column signal line $L_{SIG4}$, the same effect as described in the first embodiment can be obtained, while suppressing a signal impedance between the respective column signal lines $L_{SIG}$. The power wiring pattern 20 here is a pattern for supplying a power VDD, but it may be a pattern for supplying a reference voltage and use a pattern for supplying a ground potential. Furthermore, since this needs only prevent an influence on a potential of the FD, a pattern for column signal lines corresponding to the FD (of the same potential) may additionally be provided in place of the power wiring pattern 20.

For example, this embodiment is advantageous when forming the pixel array PA according to a Bayer matrix. FIG. 8 is a schematic plan view of the pixel array region RPA (4 rows×2 columns) in the pixel array PA according to the Bayer matrix. Here, pixel signals of pixels for the same color are transferred to respective column signal lines formed by patterns superposing through an interlayer insulation film to advantageously prevent a crosstalk as compared with a case in which pixel signals of pixels for other colors are transferred. Specifically, the first column signal line $L_{SIG1}$ and the second column signal line $L_{SIG2}$ can be connected to pixels for a first color, and the third column signal line $L_{SIG3}$ and the fourth column signal line $L_{SIG4}$ can be connected to pixels for a second color. More specifically, for example, in a kth column, the first column signal line $L_{SIG1}$ and the second column signal line $L_{SIG2}$ can be connected to, for example, red pixels (Rd), and the third column signal line $L_{SIG3}$ and the fourth column signal line $L_{SIG4}$ can be connected to, for example, green pixels (Gr). Then, in the (k+1)th column, the first column signal line $L_{SIG1}$ and the second column signal line $L_{SIG2}$ can be connected to, for example, green pixels (Gr), and the third column signal line $L_{SIG3}$ and the fourth column signal line $L_{SIG4}$ can be connected to, for example, blue pixels (B). Here, the Bayer matrix (three colors of red, green and blue) has been exemplified. However, the present invention is not limited to the Bayer matrix and is applicable even when using other colors.

Although the two embodiments have been described above, the present invention is not limited to them. Obviously, the objects, states, applications, functions, and other specifications of the present invention can be changed as needed, and other embodiments can implement the present invention. The sensor unit, for example, is formed as a CMOS image sensor, and may be implemented as any other types of sensors. In cooperation with or instead of the controller, an OS or the like operating on a computer may perform all or part of the operation control of each functional block described above.

A solid-state image sensor included in a camera has been described according to the embodiments described above. The concept of camera includes not only a device whose principal operation is to image but also a device (for example, a personal computer or portable terminal) additionally provided with an imaging function. The camera can include the solid-state image sensor, according to the present invention exemplified as the above embodiments, and the processor which processes a signal output from the solid-state image sensor. The processor can include, for example, an A/D converter, and a processor which processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-149755, filed Jul. 3, 2012, which is hereby incorporated by reference herein in its entirety.

What is claimed is:

1. A solid-state image sensor including a pixel array region in which a plurality of pixels are arranged to form a plurality of rows and columns,
wherein in the pixel array region, a first column signal line and a second column signal line configured to transfer signals from corresponding pixels respectively, and a control line configured to control the corresponding pixels are arranged,
a region in which the first column signal line, the second column signal line and the control line are arranged includes a wiring portion including a first region, a second region and a third region arranged sequentially in a column direction,
the first column signal line includes a first pattern arranged in a first wiring layer of the first wiring layer and a second wiring layer which are different layers in the first region and the second region, and includes a second pattern arranged in the second wiring layer in the third region, and the first pattern and the second pattern are electrically connected by an electrically conductive member between the second region and the third region,
the second column signal line includes a third pattern arranged in the second wiring layer in the first region, and includes a fourth pattern arranged in the first wiring layer in the second region and the third region, and the third pattern and the fourth pattern are electrically connected by an electrically conductive member between the first region and the second region, and
the first pattern and the third pattern are superposed through an interlayer insulation film in the first region, the second pattern and the fourth pattern are superposed through an interlayer insulation film in the third region, and the control line includes a pattern arranged in the second wiring layer in the second region and intersecting with the first pattern and the fourth pattern through an interlayer insulation film.

2. The sensor according to claim 1, wherein at least two wiring portions are formed.

3. The sensor according to claim 1, wherein
a third column signal line and a fourth column signal line configured to transfer signals from the corresponding pixels respectively, are also arranged in the pixel array region, and a region in which the third column signal line, the fourth column signal line and the control line are arranged includes a second wiring portion including a fourth region, a fifth region and a sixth region arranged sequentially in the column direction,
the third column signal line includes a fifth pattern arranged in the first wiring layer in the fourth region and the fifth region, and includes a sixth pattern arranged in the second wiring layer in the sixth region, and the fifth pattern and the sixth pattern are electrically connected by an electrically conductive member between the fifth region and the sixth region,
the fourth column signal line includes a seventh pattern arranged in the second wiring layer in the fourth region, and includes an eighth pattern arranged in the first wiring layer in the fifth region and the sixth region, and the seventh pattern and the eighth pattern are electrically connected by an electrically conductive member between the fourth region and the fifth region, and
the fifth pattern and the seventh pattern are superposed through an interlayer insulation film in the fourth region, the sixth pattern and the eighth pattern are superposed through an interlayer insulation film in the sixth region, and the control line includes a pattern arranged in the second wiring layer in the fifth region and intersecting with the fifth pattern and the eighth pattern through an interlayer insulation film.

4. The sensor according to claim 3, wherein the pixel array is formed according to a Bayer matrix, the first column signal line and the second column signal line are connected to pixels for a first color, and the third column signal line and the fourth column signal line are connected to pixels for a second color.

5. The sensor according to claim 4, wherein at least two second wiring portions are formed.

6. The sensor according to claim 3, wherein a pattern configured to supply a reference voltage is arranged in the first wiring layer between the first pattern to the fourth pattern and the fifth pattern to the eighth pattern.

7. The sensor according to claim 1, wherein the first pattern and the third pattern are not superposed through the interlayer insulation film between the first region and the second region, and the second pattern and the fourth pattern are not superposed through the interlayer insulation film between the second region and the third region.

8. A camera comprising:
a solid-state image sensor according to claim 1; and
a processor configured to process a signal output from said solid-state image sensor.

* * * * *